United States Patent
Steinmann

(10) Patent No.: US 6,989,225 B2
(45) Date of Patent: Jan. 24, 2006

(54) STEREOLITHOGRAPHIC RESINS WITH HIGH TEMPERATURE AND HIGH IMPACT RESISTANCE

(75) Inventor: Bettina Steinmann, Praroman (CH)

(73) Assignee: 3D Systems, Inc., Valencia, CA (US)

(*) Notice: Subject to any disclaimer, the term of this patent is extended or adjusted under 35 U.S.C. 154(b) by 166 days.

(21) Appl. No.: 10/338,074

(22) Filed: Jan. 7, 2003

(65) Prior Publication Data

US 2004/0013977 A1    Jan. 22, 2004

Related U.S. Application Data

(63) Continuation-in-part of application No. 10/199,226, filed on Jul. 18, 2002, now abandoned.

(51) Int. Cl.
G03F 7/29     (2006.01)
G03F 7/027    (2006.01)
B29C 67/00    (2006.01)
C08G 59/68    (2006.01)

(52) U.S. Cl. .............. 430/280.1; 430/269; 264/401

(58) Field of Classification Search ............ 430/280.1, 430/269; 264/401
See application file for complete search history.

(56) References Cited

U.S. PATENT DOCUMENTS

| | | | |
|---|---|---|---|
| 3,708,296 A | | 1/1973 | Schlesinger |
| 4,119,640 A | * | 10/1978 | Hodakowski et al. ....... 549/546 |
| 4,751,102 A | | 6/1988 | Adair et al. |
| 4,772,530 A | | 9/1988 | Gottschalk et al. |
| 4,772,541 A | | 9/1988 | Gottschalk et al. |
| 4,821,050 A | * | 4/1989 | Yabe et al. ................. 346/137 |
| 5,002,856 A | | 3/1991 | Anderson |
| 5,476,748 A | * | 12/1995 | Steinmann et al. ......... 430/269 |
| 5,614,594 A | * | 3/1997 | Miyazaki et al. ......... 525/327.3 |
| 5,874,041 A | | 2/1999 | Matsumura et al. |
| 5,972,563 A | | 10/1999 | Steinmann et al. |
| 6,100,007 A | | 8/2000 | Pang et al. |
| 6,136,497 A | | 10/2000 | Melisaris et al. |
| 6,251,557 B1 | | 6/2001 | Lapin et al. |
| 6,287,748 B1 | | 9/2001 | Lawton |
| 6,833,231 B2 | * | 12/2004 | Moussa et al. ........... 430/280.1 |

FOREIGN PATENT DOCUMENTS

| | | |
|---|---|---|
| EP | 0 035 969 B1 | 2/1985 |
| EP | 0 044 274 B1 | 9/1985 |
| EP | 0 094 914 B1 | 9/1986 |
| EP | 0 094 915 B1 | 1/1987 |
| EP | 0 164 314 B1 | 1/1988 |
| EP | 0 153 904 | 9/1988 |
| EP | 0 223 587 B1 | 2/1991 |

* cited by examiner

Primary Examiner—Cynthia Hamilton
(74) Attorney, Agent, or Firm—Ralph D'Alessandro; William A. Simons

(57) ABSTRACT

A liquid radiation-curable composition that comprises
(A) at least one polymerizing organic substance comprising a mixture of
  (1) at least one alicyclic epoxide having at least two epoxy groups; and
  (2) at least one difunctional or higher functional glycidylether of a polyhydric compound;
(B) at least one free-radical polymerizing organic substance comprising a mixture of
  (1) optionally, at least one trifunctional or higher functional (meth)acrylate compound; and
  (2) at least one aromatic di(meth)acrylate compound;
(C) at least one cationic polymerization initiator;
(D) at least one free-radical polymerization initiator;
(E) optionally, at least one hydroxyl-functional aliphatic compound; and
(F) at least one hydroxyl-functional aromatic compound;

wherein the concentration of hydroxyl groups in the radiation-curable composition is at least about 1.1 equivalent OH groups per kilogram;

wherein the concentration of epoxy groups in the radiation-curable composition is at least about 5.5 equivalent epoxy groups per kilogram; and wherein the amount of trifunctional or higher functional (meth)acrylate compound (B)(1) is from 0% to about 3% of the composition and the amount of aromatic di(meth)acrylate compound (B)(2) is at least 10% of the composition.

26 Claims, No Drawings

STEREOLITHOGRAPHIC RESINS WITH HIGH TEMPERATURE AND HIGH IMPACT RESISTANCE

RELATED APPLICATIONS

This is a continuation-in-part of application, Ser. No. 10/199,226, now abandoned, filed on Jul. 18, 2002.

BACKGROUND OF THE INVENTION

1. Field of the Invention

The present invention relates to selected liquid, radiation-curable compositions which are particularly suitable for the production of three-dimensional articles by stereolithography as well as a process for the production of cured articles and the cured three-dimensional shaped article themselves. In particular, this invention relates to liquid, radiation-curable resin compositions from which cured three-dimensional shaped articles having both high temperature resistance and high impact resistance can be made.

2. Brief Description of Art

The production of three-dimensional articles of complex shape by means of stereolithography has been known for a relatively long time. In this technique the desired shaped article is built up from a liquid, radiation-curable composition with the aid of a recurring, alternating sequence of two steps (a) and (b); in step (a), a layer of the liquid, radiation-curable composition, one boundary of which is the surface of the composition, is cured with the aid of appropriate radiation, generally radiation produced by a preferably computer-controlled laser source, within a surface region which corresponds to the desired cross-sectional area of the shaped article to be formed, at the height of this layer, and in step (b) the cured layer is covered with a new layer of the liquid, radiation-curable composition, and the sequence of steps (a) and (b) is repeated until a so-called green model of the desired three-dimensional shape is finished. This green model is, in general, not yet fully cured and must therefore, normally, be subjected to post-curing.

The mechanical strength of the green model (modulus of elasticity, fracture strength), also referred to as green strength, constitutes an important property of the green model and is determined essentially by the nature of the stereolithographic-resin composition employed. Other important properties of a stereolithographic resin composition include a high sensitivity for the radiation employed in the course of curing and a minimum curl factor, permitting high shape definition of the green model. In addition, for example, the precured material layers should be readily wettable by the liquid stereolithographic resin composition, and of course not only the green model but also the ultimately cured shaped article should have optimum mechanical properties.

Another requirement that has recently become a high priority for stereolithography users is the high temperature performance of cured articles produced by stereolithography. It is usually measured by the Heat Deflection Temperature (HDT) or Glass Transition Temperature ($T_g$). The HDT value is determined by the ASTM method D648 applying a load of 66 psi.

In order to achieve the desired balance of properties, different types of resin systems have been proposed. For example, radical-curable resin systems have been proposed. These systems generally consist of one or more (meth) acrylate compounds (or other free-radical polymerizable organic compounds) along with a free-radical photoinitiator for radical generation. U.S. Pat. No. 5,418,112 describes one such radical-curable system.

Another type of resin composition suitable for this purpose is a dual type system that comprises (i) epoxy resins or other types of cationic polymerizable compounds; (ii) cationic polymerization initiator; (iii) acrylate resins or other types of free radical polymerizable compounds; and (iv) a free radical polymerization initiator. Examples of such dual or hybrid systems are described in U.S. Pat. No. 5,434,196.

A third type of resin composition useful for this application also includes (v) reactive hydroxyl compounds such as polyether-polyols. Examples of such hybrid systems are described in U.S. Pat. No. 5,972,563.

Despite all previous attempts, there exists a need for a liquid hybrid stereolithographic composition capable of producing cured articles that possesses both high temperature resistance and high impact resistance. The present invention presents a solution to that need.

BRIEF SUMMARY OF THE INVENTION

Therefore, one aspect of the present invention is directed to a liquid radiation-curable composition useful for the production of three dimensional articles by stereolithography that comprises
  (A) at least one cationically polymerizing organic substance comprising a mixture of
    (1) at least one alicyclic epoxide having at least two epoxy groups; and
    (2) at least one difunctional or higher functional glycidylether of a polyhydric compound;
  (B) at least one free-radical polymerizing organic substance comprising
    (1) at least one aromatic di(meth)acrylate compound; and
    (2) optionally, at least one trifunctional or higher functional (meth)acrylate compound
  (C) at least one cationic polymerization initiator;
  (D) at least one free-radical polymerization initiator;
  (E) optionally at least one hydroxyl-functional aliphatic compound; and
  (F) at least one hydroxyl-functional aromatic compound; wherein the concentration of hydroxyl groups in the radiation-curable composition is at least about 1.1 equivalent OH groups per kilogram; wherein the concentration of epoxy groups in the radiation-curable composition is at least about 5.5 equivalent epoxy groups per kilogram; and wherein the amount of trifunctional or higher functional (meth)acrylate compound (B)(2) is from 0% to about 3% of the composition and the amount of aromatic di(meth)acrylate compound (B)(1) is at least 10% of the composition.

Another aspect of the present invention is directed to a process for forming a three-dimensional article, said process comprising the steps:
  (1) coating a thin layer of a radiation-curable composition onto a surface;
  (2) exposing said thin layer imagewise to actinic radiation to form an imaged cross-section, wherein the radiation is of sufficient intensity to cause substantial curing of the thin layer in the exposed areas;
  (3) coating a thin layer of the composition onto the previously exposed imaged cross-section;
  (4) exposing said thin layer from step (3) imagewise to actinic radiation to form an additional imaged cross-section, wherein the radiation is of sufficient intensity to cause substantial curing of the thin layer in the exposed areas and to cause adhesion to the previously exposed imaged cross-section;

(5) repeating steps (3) and (4) a sufficient number of times in order to build up the three-dimensional article;

wherein the radiation-curable composition is that which is described above.

Still another aspect of the present invention is directed to three-dimensional articles made by the above process using the above-noted radiation-curable composition.

It is an advantage that the liquid radiation-curable composition of the present invention provides parts with high modulus of flexure when used in a stereolithography system to form a three-dimensional object.

It is another advantage that the liquid radiation-curable composition of the present invention provides parts with good elongation to break and which are not brittle when used in a stereolithography system to form a three-dimensional object.

It is a further advantage that the liquid radiation-curable composition of the present invention provides parts with high heat deflection and good thermal properties after exposure to a thermal cycle for heat treatment when used in a stereolithography system to form a three-dimensional object.

It is yet another advantage that the liquid radiation-curable composition of the present invention provides parts with stable properties in the presence of moisture when used in a stereolithography system to form a three-dimensional object.

It is still another advantage that the liquid radiation-curable composition of the present invention provides a resin material that permits a reliable process to produce high quality three-dimensional parts to be easily designed.

DETAILED DESCRIPTION OF THE INVENTION

The term "(meth)acrylate" as used in the present specification and claims refers to both acrylates and methacrylates.

The term "liquid" as used in the present specification and claims is to be equated with "liquid at room temperature" which is, in general, a temperature between 5° C. and 30° C.

The novel compositions herein contain, in the broadest sense, a mixture in certain proportions of at least two selected cationically polymerizable organic substances; at least one selected free-radical polymerizing organic substance; at least one cationic polymerization initiator; at least one free-radical polymerization initiator; optionally at least one hydroxyl-functional aliphatic compound and at least one hydroxyl-functional aromatic compound. The compositions may further optionally contain other free radical polymerizing organic substances and additives.

(A) Cationically Polymerizable Organic Substances

The compositions of the present invention contain two types of cationically polymerizing organic substances. One type is an alicyclic epoxide having at least two epoxy groups. The other type is at least one difunctional or higher functional-glycidylether of a polyhydric compound.

(1) Alicyclic Epoxides Having at Least Two Epoxy Groups

The cationically polymerizing alicyclic epoxides having at least two epoxy groups include any cationically curable liquid or solid compound that may be an alicyclic polyglycidyl compound or cycloaliphatic polyepoxide which on average possesses two or more epoxide groups (oxirane rings) in the molecule. Such resins may have a cycloaliphatic ring structure that contain the epoxide groups as side groups or the epoxide groups from part of the alicyclic ring structure. Such resins of these types are known in general terms and are commercially available.

Examples of compounds in which the epoxide groups from part of an alicyclic ring system include bis(2,3-epoxycyclopentyl) ether; 2,3-epoxycyclopentyl glycidyl ether, 1,2-bis(2,3-epoxycyclopentyloxy)ethane; bis(4-hydroxycyclohexyl) methane diglycidyl ether, 2,2-bis(4-hydroxycyclohexyl) propane diglycidyl ether; 3,4-epoxycyclohexylmethyl-3',4'-epoxycyclohexanecarboxylate; 3,4-epoxy-6-methyl-cyclohexylmethyl 3,4-epoxy-6-methylcyclohexanecarboxylate; di(3,4-epoxycyclohexylmethyl) hexanedioate; di(3,4-epoxy-6-methylcyclohexylmethyl) hexanedjoate; ethylenebis(3,4-epoxycyclohexane-carboxylate, ethanediol di(3,4-epoxycyclohexylmethyl) ether; vinylcyclohexane dioxide; dicyclopentadiene diepoxide or 2-(3,4-epoxycyclohexyl-5,5-spiro-3,4-epoxy)cyclohexane-1,3-dioxane.

The preferred alicyclic epoxide is 3,4-epoxycyclohexylmethyl-3',4'-epoxy-cyclohexanecarboxylate which is available as Cyracure UVR 6110.

These alicyclic epoxides preferably constitute from about 50% to about 90% by weight, more preferably from about 60% to 85% by weight; of the total cationic polymerizing organic substances.

Also, these alicyclic epoxides preferably constitute from about 50% to about 60% by weight of the total liquid radiation-curable composition.

(2) Difunctional or Higher Functional Glycidylethers of a Polyhydric Compound

The cationically polymerizing difunctional or higher functional glycidylethers of a polyhydric compound are obtainable by reacting a compound having at least two free alcoholic hydroxyl groups with a suitably substituted epichlorohydrin under alkaline conditions or in the presence of an acidic catalyst followed by alkali treatment. Ethers of this type may be derived from acyclic alcohols, such as ethylene glycol; propane-1,2-diol or poly (oxy propylene) glycols; propane-1,3-diol; butane-1,4-diol; poly (oxytetramethylene) glycols; pentane-1,5-diols; hexane-1,6-diol; hexane-2,4,6-triol; glycerol; 1,1,1-trimethylol propane; bistrimethylol propane; pentacrytliritol; 2,4,6-triol sorbitol and the like when reacted with polyepichlorohydrins. Such resins of these types are known in general terms and are commercially available.

The most preferred difunctional or higher functional glycidylether is trimethylol propane triglycidylether which is available as Araldite DY-T.

These difunctional or higher functional glycidylether preferably constitute from about 10% to about 50% by weight, more preferably about 15% to about 40% by weight of the total cationic polymerizing organic substances.

Also, these difunctional or higher functional glycidylethers preferably constitute about 10% to about 25% by weight, more preferably about 12% to about 22% by weight, of the total liquid radiation-curable composition.

(B) Free-Radical Polymerizing Organic Substance

The compositions of the present invention contain at least one aromatic di(meth) acrylate compound as a free-radical polymerizing organic substance. Optionally, the composition of the present invention also contain at least one trifunctional or higher functionality (meth) acrylate compound.

(1) Aromatic Di(meth)acrylate Compounds

The aromatic di(meth)acrylate compounds include difunctional aromatic acrylates or difunctional aromatic methacrylates. Suitable examples of these di(meth)acrylate compounds include di(meth)acrylates of aromatic diols such as hydroquinone, 4,4'-dihydroxybis-phenyl, bisphenol A, bisphenol F, bisphenol S, ethoxylated or propoxylated bisphenol A, ethoxylated or propoxylated bisphenol F or ethoxylated or propoxylated bisphenol S. Di(meth)acrylates of this kind are known and some are commercially available.

The most preferred aromatic difunctional (meth)acrylate is bisphenol A diglycidylether diacrylate which is available as Ebecryl 3700.

These aromatic difunctional (meth)acrylates preferably constitute from about 10% to about 20% by weight, more preferably, from about 10% to about 15% by weight of the total liquid radiation-curable composition.

(2) Optional Trifunctional or Higher Functional (Meth) acrylate Compounds

The optional trifunctional or higher functional meth(acrylates) are preferably tri-, tetra- or pentafunctional monomeric or oligomeric aliphatic, cycloaliphatic or aromatic acrylates or methacrylates. Such compounds preferably have a molecular weight of from 200 to 500.

Examples of suitable aliphatic tri-, tetra- and pentafunctional (meth)acrylates are the triacrylates and trimethacrylates of hexane-2,4,6-triol; glycerol or 1,1,1-trimethylolpropane; ethoxylated or propoxylated glycerol; or 1,1,1-trimethylolpropane; and the hydroxyl-containing tri(meth)acrylates which are obtained by reacting triepoxide compounds, for example the triglycidyl ethers of said triols, with (meth)acrylic acid. It is also possible to use, for example, pentaerythritol tetraacrylate, bistrimethylolpropane tetraacrylate, pentaerythritol monohydroxytriacrylate or -methacrylate, or dipentaerythritol monohydroxypentancrylate or -methacrylate.

Examples of suitable aromatic (tri)methacrylates are the reaction products of triglycidyl ethers of trihydric phenols and phenol or cresol novolaks containing three hydroxyl groups, with (meth)acrylic acid.

The (meth) acrylates employed as component (E) are known compounds and some are commercially available, for example from the SARTOMER Company under product designations such as SR295, SR350, SR351, SR367, SR399, SR444, SR454 or SR9041.

The most preferred higher functional (meth)acrylate compound is SARTOMER SR399, which dipentaerythritol monohydroxy-pentaacrylate.

These optional higher functional (meth)acrylates, if used, preferably constitute about 1% to about 5% by weight, more preferably, from about 1.5% to about 3% by weight of the total liquid radiation-curable composition.

(C) Cationic Polymerization Initiators

In the compositions according to the invention, any type of photoinitiator that, upon exposure to actinic radiation, forms cations that initiate the reactions of the epoxy material(s) can be used. There are a large number of known and technically proven cationic photoinitiators for epoxy resins that are suitable. They include, for example, onium salts with anions of weak nucleophilicity. Examples are halonium salts, iodosyl salts or sulfonium salts, such as described in published European patent application EP 153904, sulfoxonium salts, such as described, for example, in published European patent applications EP 35969, 44274, 54509, and 0164314, or diazonium salts, such as described, for example, in U.S. Patent Nos. 3,708,296 and 5,002,856.

Other cationic photoinitiators are metallocene salts, such as described, for example, in published European applications EP 94914 and 94915. Other preferred cationic photoinitiators are mentioned in U.S. Patent Nos. 5,972,563 (Steinmann et al.); 6,100,007 (Pang et aL) and 6,136,497 (Melisaris et al.).

More preferred commercial cationic photoinitiators are UVI-6974, UVI-6970, UVI-6990 (manufactured by Union Carbide Corp.), CD-1010, CD-1011, CD-1012 (manufactured by Sartomer Corp.), Adekaoptomer SP-150, SP-151, SP-170, SP-171 (manufactured by Asahi Denka Kogyo Co., Ltd.), Irgacure 261 (Ciba Specialty Chemicals Corp.), CI-2481, CI-2624, CI-2639, CI-2064 (Nippon Soda Co., Ltd.), DTS-102, DTS-103, NAT-103, NDS-103, TPS-103, MDS-103, MPI-103, BBI-103 (Midori Chemical Co., Ltd.). Most preferred are UVI-6974, CD-1010, UVI-6970, Adekaoptomer SP-170, SP-171, CD-1012, and MPI-103. The above mentioned cationic photo-initiators can be used either individually or in combination of two or more.

The most preferred cationic photoinitiator is a triarylsulfonium hexafluoroantemonate such as UVI-6974 (from Union Carbide).

The cationic photoinitiators may constitute from about 0.1% to about 5% by weight, more preferably, from about 0.5% to about 2.5% by weight, of the total radiation-curable composition.

(D) Free Radical Polymerization Initiators

In the compositions according to the invention, any type of photoinitiator that forms free radicals when the appropriate irradiation takes place can be used. Typical compounds of known photoinitiators are benzoins, such as benzoin, benzoin ethers, such as benzoin methyl ether, benzoin ethyl ether, and benzoin isopropyl ether, benzoin phenyl ether, and benzoin acetate, acetophenones, such as acetophenone, 2,2-dimethoxyacetophenone, 4-(phenylthio)acetophenone, and 1,1-dichloroacetophenone, benzil, benzil ketals, such as benzil dimethyl ketal, and benzil diethyl ketal, anthraquinones, such as 2-methylanthraquinone, 2-ethylanthraquinone, 2-tert-butylanthraquinone, 1-chloroanthraquinone, and 2-amylanthraquinone, also triphenylphosphine, benzoylphosphine oxides, such as, for example, 2,4,6-trimethylbenzoyldiphenylphosphine oxide (Lucirin® TPO), benzophenones, such as benzophenone, and 4,4'-bis(N,N'-dimethylamino)benzophenone, thioxanthones and xanthones, acridine derivatives, phenazene derivatives, quinoxaline derivatives or 1-phenyl-1,2-propanedione-2-O-benzoyloxime, 1-aminophenyl ketones or 1-hydroxyphenyl ketones, such as 1-hydroxycyclohexyl phenyl ketone, phenyl (1-hydroxyisopropyl)ketone and 4-isopropylphenyl(1-hydroxyisopropyl)ketone, or triazine compounds, for example, 4'methyl thiophenyl-1-di(trichloromethyl)-3,5 S-triazine, S-triazine-2-(stylbene)-4,6-bis-trichloromethyl, and paramethoxy stiryl triazine, all of which are known compounds.

Especially suitable free-radical photoinitiators, which are normally used in combination with a He/Cd laser, operating at for example 325 nm, an Argon-ion laser, operating at for example 351 nm, or 351 and 364 nm, or 333, 351, and 364 nm, or a frequency tripled YAG solid state laser, having an output of 351 or 355 nm, as the radiation source, are acetophenones, such as 2,2-dialkoxybenzophenones and 1-hydroxyphenyl ketones, for example 1-hydroxycyclohexyl phenyl ketone, 2-hydroxy-1-{4-(2-hydroxyethoxy)phenyl}-2-methyl-1-propane, or 2-hydroxyisopropyl phenyl ketone (also called 2-hydroxy-2,2-dimethylacetophenone), but especially 1-hydroxycyclohexyl phenyl ketone. Another class of free-radical photoinitiators comprises the benzil ketals, such as, for example, benzil dimethyl ketal. Especially an alpha-hydroxyphenyl ketone, benzil dimethyl ketal, or 2,4,6-trimethylbenzoyldiphenylphosphine oxide is used as photo-initiator.

Another class of suitable free radical photoinitiators comprises the ionic dye-counter ion compounds, which are capable of absorbing actinic rays and producing free radicals, which can initiate the polymerization of the acrylates. The compositions according to the invention that comprise ionic dye-counter ion compounds can thus be cured in a more variable manner using visible light in an adjustable wavelength range of 400 to 700 nanometers. Ionic dye-counter ion compounds and their mode of action are known, for example from published European-patent application EP 0223587 and U.S. Patent Nos. 4,751,102; 4,772,530; and 4,772,541.

Especially preferred is the free-radical photoinitiator 1-hydroxycyclohexylphenyl ketone, which is commercially available as Irgacure I-184.

The free-radical initiators constitute from about 0.1% to about 5% by weight, most preferably, from about 0.5% to about 2.5% by weight, of the total radiation curable composition.

(E) Optional Hydroxyl-Functional Aliphatic Compounds

The aliphatic hydrokyl functional compounds that may be useful for the present compositions include any aliphatic-type compounds that contain one or more reactive hydroxyl groups. Preferably these aliphatic hydroxyl functional compounds are multifunctional compounds (preferably with 2–5 hydroxyl functional groups) such as multifunctional alcohols, polyether-alcohols and polyesters.

Preferably the organic material contains two or more primary or secondary aliphatic hydroxyl groups. The hydroxyl group may be internal in the molecule or terminal. Monomers, oligomers or polymers can be used. The hydroxyl equivalent weight, i.e., the number average molecular weight divided by the number of hydroxyl groups, is preferably in the range of about 31 to 5000.

Representative examples of suitable organic materials having a hydroxyl functionality of 1 include alkanols, monoalkyl ethers of polyoxyalkyleneglycols, monoalkyl ethers of alkylene-glycols, and others.

Representative examples of useful monomeric polyhydroxy organic materials include alkylene glycols and polyols, such as 1,2,4-butanetriol; 1,2,6-hexanetriol; 1,2,3-heptanetriol; 2,6-dimethyl-1,2,6-hexanetriol; 1,2,3-hexanetriol; 1,2,3-butanetriol; 3-methyl-1,3,5-pentanetriol; 3,7,11,15-tetramethyl-1,2,3-hexadecanetriol; 2,2,4,4-tetramethyl-1,3-cyclobutanediol; 1,3-cyclopentanediol; trans-1,2-cyclooctanediol; 1,16-hexadecanediol; 1,3-propanediol; 1,4-butanediol; 1,5-pentanediol; 1,6-hexanediol; 1,7-heptanediol; 1,8-octanediol; and 1,9-nonanediol.

Representative examples of useful oligomeric and polymeric hydroxyl-containing materials include polyoxyethylene and polyoxypropylene glycols and triols of molecular weights from about 200 to about 10,000; polytetramethylene glycols of varying molecular weight; copolymers containing pendant hydroxyl groups formed by hydrolysis or partial hydrolysis of vinyl acetate copolymers, polyvinylacetal resins containing pendant hydroxyl groups; hydroxyl-terminated polyesters and hydroxyl-terminated polylactones; hydroxyl-functionalized and polyalkadienes, such as polybutadiene; and hydroxyl-terminated polyethers.

Other hydroxyl-containing monomers are 1,4-cyclohexanedimethanol and aliphatic and cycloaliphatic monohydroxy alkanols. Other hydroxyl-contaiing oligomers and polymers include hydroxyl and hydroxyl/epoxy functionalized polybutadiene, polycaprolactone diols and triols, ethylene/butylenes polyols, and combinations thereof. Examples of polyether polyols are also polypropylene glycols of various molecular weights and glycerol propoxylate-B-ethoxylate triol, as well as linear and branched polytetrahydrofuran polyether polyols available in various molecular weights, such as for example 250, 650, 1000, 2000, and 2900 MW.

Preferred hydroxyl functional compounds are, for instance, simple multifunctional alcohols, polyether-alcohols, and/or polyesters. Suitable examples of multifunctional alcohols are trimethylolpropane, trimethylolethane, pentaeritritol, di-pentaeritritol, glycerol, 1,4-hexanediol, 1,4-hexanedimethanol and the like.

Suitable hydroxyfunctional polyetheralcohols are, for example, alkoxylated trimethylolpropane, in particular the ethoxylated or propoxylated compounds, polyethyleneglycol-200 or -600 and the like.

Suitable polyesters include, hydroxyfunctional polyesters from diacids and diols with optionally small amounts of higher functional acids or alcohols. Suitable diols are those described above. Suitable diacids are, for example, adipic acid, dimer acid, hexahydrophthalic acid, 1,4-cyclohexane dicarboxylic acid and the like. Other suitable ester compounds include caprolactone based oligo- and polyesters such as the trimethylolpropane-triester with caprolactone, Tone®301 and Tone®310 (Union Carbide Chemical and Plastics Co., or UCCPC). The ester based polyols preferably have a hydroxyl number higher than about 50, in particular higher than about 100. The acid number preferably is lower than about 10, in particular lower than about 5. The most preferred aliphatic hydroxyl functional compound is trimethylolpropane, which is commercially available.

If used, these optional aliphatic hydroxyl functional compounds are preferably present from about 1 to 3% by weight of the total liquid radiation-curable composition.

(F) Hydroxyl-Functional Aromatic Compounds

The aromatic hydroxyl functional compounds that may be useful for the present compositions include aromatic-type compounds that contain one or more reactive hydroxyl groups. Preferably these aromatic hydroxyl functional compounds would include phenolic compounds having at least 2 hydroxyl groups as well as phenolic compounds having at least 2 hydroxyl groups which are reacted with ethylene oxide, propylene oxide or a combination of ethylene oxide and propylene oxide.

The most preferred aromatic functional compounds include bisphenol A, bisphenol S, ethoxylated bisphenol A, and ethoxylated bisphenol S.

These aromatic hydroxyl functional compounds are preferably present from about 5% to about 20% by weight, more preferably, from about 7% to about 16% by weight, of the total liquid radiation-cured composition.

(G) Optional Additives

If necessary, the resin composition for stereolithography applications according to the present invention may contain other materials in suitable amounts, as far as the effect of the present invention is not adversely affected. Examples of such materials include radical-polymerizable organic substances other than the aforementioned cationically polymerizable organic substances; heat-sensitive polymerization initiators, various additives for resins such as coloring agents such as pigments and dyes, antifoaming agents, leveling agents, thickening agents, flame retardants and antioxidants.

Two preferred optional additives are pyrene and benzyldimethylamine. The former acts as a sensitizer and the latter acts as a cationic stabilizer. If used, optional additives such as these preferably constitute from about 0.001 to about 5% by weight of the total liquid radiation-curable compositions.

For some applications, it is also desirable to use a filler. The optional filler to be used in the present invention is a reactive or non-reactive, inorganic or organic, powdery, fibrous or flaky material. Examples of organic filler materials are polymeric compounds, thermoplastics, core-shell, aramid, Kevlar, nylon, crosslinked polystyrene, crosslinked poly (methyl methacrylate), polystyrene or polypropylene, crosslinked polyethylene powder, crosslinked phenolic resin powder, crosslinked urea resin powder, crosslinked melamine resin powder, crosslinked polyester resin powder and crosslinked epoxy resin powder. Examples of inorganic fillers are glass or silica beads, calcium carbonate, barium sulfate, talc, mica, glass or silica bubbles, zirconium silicate, iron oxides, glass fiber, asbestos, diatomaceous earth, dolomite, powdered metals, titanium oxides, pulp powder, kaoline, modified kaolin, hydrated kaolin metallic filers, ceramics and composites. Mixtures of organic and/or inorganic fillers can be used.

Further examples of preferred fillers are microcrystalline silica, crystalline silica, amorphous silica, alkali alumino silicate, feldspar, woolastonite, alumina, aluminum hydroxide, glass powder, alumina trihydrate, surface treated alumina trihydrate, and alumina silicate. Each of the preferred fillers is commercially available. The most preferred filler materials are inorganic fillers, such as imsil, Novasite, mica, amorphous silica, feldspar, and alumina trihydrate. Mica as a filler is very attractive because it shows low tendency to settle out from the photocurable compositions. It has transparency to UV light, low tendency to refract or reflect incident light and it provides good dimensional stability and heat resistance.

The filler to be used for the resin composition for stereolithography according to the present invention must satisfy requirements that it hinders neither cationic nor radical polymerizations and the filled SL composition has a relatively low viscosity suitable for the stereolithography process. These fillers may be used alone or as a mixture of two or more of them depending upon the desired performance. The fillers used in the present invention may be neutral acidic or basic. The filler particle size may vary depending on the application and the desired resin characteristics. It may vary between 50 nanometers and 50 micrometers.

The filler material can optionally be surfaced treated with various compounds-coupling agents. Examples include methacryloxy propyl trimethoxy silane, beta-(3,4-epoxycyclohexyl) ethyl trimethoxy silane, gamma-glycidoxy propyl trimethoxy silane and methyl triethoxy silane. The most preferred coupling agents are commercially available from Osi Chemicals Corp. and other chemical suppliers.

The filler loading is preferably from about 0.5 to about 90%, more preferably from about 5 to about 75%, most preferably from about 5 to about 60% by weight with respect to the total weight of the filled resin composition.

Formulation Preparation

The novel compositions can be prepared in a known manner by, for example, premixing individual components and then mixing these premixes, or by mixing all of the components using customary devices, such as stirred vessels, in the absence of light and, if desired, at slightly elevated temperature.

One preferred liquid radiation-curable composition useful for the production of three dimensional articles by stereolithography comprises
- (A) at least one cationically polymerizing organic substance comprising a mixture of:
  - (1) 3,4-epoxycyclohexylmethyl-3',4'-epoxycyclohexanecarboxylate; and
  - (2) trimethylol propane triglycidylether;
- (B) at least one free-radical polymerizing organic substance comprising a mixture of:
  - (1) at least one di(meth) acrylate of an aromatic diol; and
  - (2) at least one tri-, tetra or pentafunctional monomeric or oligomeric aliphatic, cycloaliphatic or aromatic (meth)acrylate;
- (C) at least one cationic polymerization initiator;
- (D) at least one free radical polymerization initiator;
- (E) trimethylolpropane; and
- (F) ethoxylated bisphenol A;

wherein the concentration of hydroxyl groups in the radiation-curable composition is at least 1.1 equivalent OH groups per kilogram, wherein the concentration of epoxy groups in the radiation-curable composition is at least about 5.5 equivalent epoxy group per kilogram; and the amount of component B(2) is from about 1% to about 3% of the total compositions and the amount of component B(1) is from about 10% to about 20% by weight of the total composition.

As stated above, the radiation curable composition must have a minimum equivalent OH per kilogram concentration of 1.1. Preferably, this is from about 1.2 to about 2.5 OH equivalents. Also, the composition must have minimum equivalent epoxy per kilogram concentration of at least 5.5. Preferably, this is from about 5.7 to about 7 epoxy equivalents.

Process of Making Cured Three-Dimensional Articles

The novel compositions can be polymerized by irradiation with actinic light, for example by means of electron beams, X-rays, UV or VIS light, preferably with radiation in the wavelength range of 280–650 nm. Particularly suitable are laser beams of HeCd, argon or nitrogen and also metal vapor and NdYAG lasers. This invention is extended throughout the various types of lasers existing or under development that are to be used for the stereolithography process, e.g., solid state, argon ion, helium cadmium lasers, and the like. The person skilled in the art is aware that it is necessary, for each chosen light source, to select the appropriate photoinitiator and, if appropriate, to carry out sensitization. It has been recognized that the depth of penetration of the radiation into the composition to be polymerized, and also the operating rate, are directly proportional to the absorption coefficient and to the concentration of the photoinitiator. In stereolithography it is preferred to employ those photoinitiators which give rise to the highest number of forming free radicals or cationic particles and which enable the greatest depth of penetration of the radiation into the compositions which are to be polymerized.

The invention additionally relates to a method of producing a cured product, in which compositions as described above are treated with actinic radiation. For example, it is possible in this context to use the novel compositions as adhesives, as coating compositions, as photoresists, for example as solder resists, or for rapid prototyping, but especially for stereolithography. When the novel mixtures are employed as coating compositions, the resulting coatings on wood, paper, metal, ceramic or other surfaces are clear and hard. The coating thickness may vary greatly and can for instance be from about 0.01 mm to about 1 mm. Using the novel mixtures it is possible to produce relief images for printed circuits or printing plates directly by irradiation of the mixtures, for example by means of a computer-controlled laser beam of appropriate wavelength or employing a photomask and an appropriate light source.

One specific embodiment of the above mentioned method is a process for the stereolithographic production of a three-dimensional shaped article, in which the article is built up from a novel composition with the aid of a repeating, alternating sequence of steps (a) and (b); in step (a), a layer of the composition, one boundary of which is the surface of the composition, is cured with the aid of appropriate radiation within a surface region which corresponds to the desired cross-sectional area of the three-dimensional article to be formed, at the height of this layer, and in step (b) the freshly cured layer is covered with a new layer of the liquid, radiation-curable composition, this sequence of steps (a) and (b) being repeated until an article having the desired shape is formed. In this process, the radiation source used is preferably a laser beam, which with particular preference is computer-controlled.

In general, the above-described initial radiation curing, in the course of which the so-called green models are obtained which do not as yet exhibit adequate strength, is followed then by the final curing of the shaped articles by heating and/or further irradiation.

The present invention is further described in detail by means of the following Examples and Comparisons. All parts and percentages are by weight and all temperatures are degrees Celsius unless explicitly stated otherwise.

EXAMPLES

The trade names of the components as indicated in the examples below correspond to the chemical substances as recited in the following Table 1.

TABLE 1

| Trade Name | Chemical Designation |
|---|---|
| Cyracure UVR 6110 | 3,4-epoxycyclohexylmethyl-3',4'-epoxycyclohexane-carboxylate |
| Araldite DY-T | trimethylolpropane triglycidylether |
| Simulsol BPPE/A | ethoxylated bisphenol A (MW 600) |
| Simulsol BPRE | ethoxylated bisphenol A (MW 750) |
| Ebecryl 3700 | bisphenol A - diglycidylether diacrylate |
| Sartomer SR 399 | dipentaerythritol monohydroxy-pentaacrylate |
| Irgacure I-184 | 1-hydroxycyclohexyl phenyl ketone |
| Cyracure UVI - 6974 | triarylsulfonium hexafluoroantimonate |
| TMP | trimethylolpropane |
| Irgacure 651 | 2,2-dimethoxy-2-phenylacetophenone |

The formulations indicated in the Examples below were prepared by mixing the components with a stirrer at 60° C. until a homogeneous composition was obtained. The physical data relating to these formulations was obtained as follows:

The viscosity of each formulation was determined at 30° C. using a Brookfield viscometer.

The photosensitivity of the liquid formulations was determined on so-called window panes. In this determination, single-layer test specimens were produced using different laser energies, and the layer thicknesses obtained were measured. The plotting of the resulting layer thickness on a graph against the logarithm of the irradiation energy used gave a "working curve." The slope of this curve is termed Dp (given in mm or mils). The energy value at which the curve passes through the x-axis is termed Ec (and is the energy at which gelling of the material still just takes place; cf. P. Jacobs, Rapid Prototyping and Manufacturing, Soc. of Manufacturing Engineers, 1991, p. 270 ff.).

The measured post-cure mechanical properties of the formulations were determined on three-dimensional specimens produced stereolithographically with the aid of a He/Cd, Ar/UV or Nd-Yag-laser.

The Glass Transition temperatures of each formulation were determined by the "DMA" method.

The Tensile Modulus (MPa), Tensile Strength (MPa), Elongation at Break (%), were all determined according to the ISO 527 method. The Impact Resistance (notched, $kJ/m^2$) was determined according to the ISO 179 method. The hardness of the cured resins was determined according to the Shore D test.

The epoxy group concentrations (equivalents per kilogram) were calculated by the formula: weight %×10/equ. weight The hydroxyl group concentrations (equivalents per kilogram) were calculated by the formula: weight %×10/equ. weight.

Example 1

The following components were mixed to produce a homogeneous liquid composition:

| Component | Percentage (by wt.) | equ/kg (epoxy or hydroxyl) |
|---|---|---|
| Cyracure UVR 6110 | 55 | 4.37 |
| Araldite DY-T | 15 | 1.49 |
| Simulsol BPPE/A | 10 | 0.30 |
| TMP | 2 | 0.45 |
| Ebecryl 3700 | 13.5 | 0.55 |
| Cyracure UVI-6974 | 2.5 | |
| Irgacure I-651 | 2 | |

Example 2

The following components were mixed to produce a homogeneous liquid composition:

| Component | Percentage (by wt.) | equ/kg (epoxy or hydroxyl) |
|---|---|---|
| Cyracure UVR 6110 | 47.6 | 3.78 |
| Araldite DY-T | 20 | 1.99 |
| Simulsol BPRE | 10 | 0.27 |
| TMP | 2 | 0.45 |
| Ebecryl 3700 | 16.5 | 0.68 |
| Cyracure UVI-6974 | 2.5 | |
| Irgacure I-184 | 1 | |
| Pyrene (additive) | 0.4 | |

Example 3

The following components were mixed to produce a homogeneous liquid composition:

| Component | Percentage (by wt.) | equ/kg (epoxy or hydroxyl) |
|---|---|---|
| Cyracure UVR 6110 | 57.6 | 4.57 |
| Araldite DY-T | 15 | 1.49 |
| Simulsol BPPE/A | 8 | 0.24 |
| TMP | 2 | 0.45 |
| Ebecryl 3700 | 13.5 | 0.55 |
| Cyracure UVI-6974 | 2 | |
| Irgacure I-184 | 1.5 | |
| Pyrene (additive) | 0.4 | |

Example 4

The following components were mixed to produce a homogeneous liquid composition:

| Component | Percentage (by wt.) | equ/kg (epoxy or hydroxyl) |
|---|---|---|
| Cyracure UVR 6110 | 54.1 | 4.29 |
| Araldite DY-T | 15 | 1.49 |
| Simulsol BPPE/A | 12 | 0.36 |
| TMP | 2 | 0.45 |
| Sartomer SR 399 | 3 | |
| Ebecryl 3700 | 10 | 0.41 |
| Cyracure UVI-6974 | 2 | |
| Irgacure I-184 | 1.5 | |
| Pyrene | 0.4 | |

Example 5

The following components were mixed to produce a homogeneous liquid composition:

| Component | Percentage (by wt.) | equ/kg (epoxy or hydroxyl) |
|---|---|---|
| Cyracure UVR 6110 | 53.292 | 4.23 |
| Araldite DY-T | 15 | 1.49 |
| Simulsol BPPE/A | 12 | 0.36 |
| TMP | 2 | 0.45 |
| Ebecryl 3700 | 10 | 0.41 |
| Sartomer SR 399 | 3 | |
| Cyracure UVI-6974 | 2.5 | |
| Irgacure I-184 | 2 | |
| Pyrene (additive) | 0.2 | |
| Benzyldimethylamine (additive) | 0.008 | |

Example 6

The following components were mixed to produce a homogeneous liquid composition:

| Component | Percentage (by wt.) | equ/kg (epoxy or hydroxyl) |
|---|---|---|
| Cyracure UVR 6110 | 54.2936 | 4.31 |
| Araldite DY-T | 15 | 1.49 |
| Simulsol BPPE/A | 12 | 0.36 |
| TMP | 2 | 0.45 |
| Ebecryl 3700 | 10 | 0.41 |
| Sartomer SR 399 | 3 | |
| Cyracure UVI-6974 | 2 | |
| Irgacure I-184 | 1.5 | |
| Pyrene (additive) | 0.2 | |
| Benzyldimethylamine (additive) | 0.0064 | |

Example 7

The following components were mixed to produce a homogeneous liquid composition:

| Component | Percentage (by wt.) | equ/kg (epoxy or hydroxyl) |
|---|---|---|
| Cyracure UVR 6110 | 56.9 | 4.52 |
| Araldite DY-T | 15 | 1.49 |
| Simulsol BPPE/A | 10 | 0.30 |
| TMP | 2 | 0.45 |
| Ebecryl 3700 | 13.5 | 0.55 |
| Cyracure UVI-6974 | 2 | |
| Irgacure I-184 | 0.6 | |

The measured photosensitivity, viscosity, glass transition temperatures of these seven (7) formulations as well as their calculated epoxy concentration and hydroxyl concentrations are shown in Table 2.

TABLE 2

Resin Formulation Properties

| Property | Example 1 | 2 | 3 | 4 | 5 | 6 | 7 |
|---|---|---|---|---|---|---|---|
| Calculated epoxy (equ/kg) | 5.86 | 5.77 | 6.06 | 5.78 | 5.72 | 5.80 | 6.01 |
| Calculated hydroxyl (equ/kg) | 1.30 | 1.39 | 1.24 | 1.22 | 1.22 | 1.22 | 1.30 |
| Viscosity (30° C.) | 531 | 569 | 503 | 474 | 556 | 466 | 449 |
| Dp (mils) | 4.38 | 3.9 | 3.64 | 4.16 | 4.89 | 4.08 | 4.9 |
| $E_c$ (mJ/cm$^2$) | 3.84 | 17.9 | 10.73 | 15.32 | 14.89 | 9.46 | 10.69 |
| $T_g$ (° C.) | 109 | 108 | 125.7 | 111 | 141 | 130 | 120 |
| Max tan Delta | 137 | 122.7 | 141.8 | 128 | NM | NM | NM |
| Hardness (Shore D) | NM | NM | NM | NM | 82 | 82 | 82 |

NM - Not Measured

The measured mechanical properties of these seven formulations after curing with one hour exposure to UV light are shown in Table 3.

TABLE 3

Mechanical Properties After 1 Hour UV Curing

| Property | Example 1 | 2 | 3 | 4 | 5 | 6 | 7 |
|---|---|---|---|---|---|---|---|
| Tensile Modules (Mpa) | NM | 1900 | 1800 | 1900 | 2100 | 2800 | 1600–2100 |
| Tensile Strength (Mpa) | NM | 49 | 49–52 | 53 | 63 | 45 | 48–54 |
| Elongation at Break (%) | NM | 9–13.25 | 5.75–8.4 | 6.25–6.75 | 7 | 7–12 | 5.4–7.4 |
| Impact Resistance (notched, mJ/cm$^2$) | NM | 4 | NM | NM | 3.9 | 4.2 | 4.2–4.5 |

NM - Not Measured

Examples 1 to 7 are, in addition to their high glass transition temperatures of more than 100° C., very tough materials, as shown by their elongation to break of more than 7% and their high impact resistance.

The measured mechanical properties for these seven formulations after curing with one hour exposure to UV light followed by slow heating from room temperature to 140° C. in a two hour period are shown in Table 4.

TABLE 4

Mechanical Properties After One Hour UV Curing and Two Hour Thermal Treatment

| Property | Example 1 | 2 | 3 | 4 | 5 | 6 | 7 |
|---|---|---|---|---|---|---|---|
| Tensile Modules (Mpa) | 2500 | 2400 | 2400 | 2240 | 2300 | 2300 | 2300–2600 |
| Tensile Strength (Mpa) | 76–84 | 82.5 | 84 | 80 | 70–83 | 70–80 | 74–78 |
| Elongation at Break (%) | 6–9.25 | 7.0–9.0 | 6.5–9 | 8.4–12.25 | 7 | 7–12 | 6.5–10.75 |
| Impact Resistance (notched, kJ/cm$^2$) | 4 | 4.1 | NM | NM | 4 | 4 | 4.3–4.7 |

NM - Not Measured

The measured mechanical properties for formulations Nos. 1 and 2 after curing with one hour exposure to UV light or after curing with one hour exposure to UV light and then thermal treatment by heating slowly from room temperature to 140° C. over a two hour period followed by exposure in 90% relative humidity for two days is shown in Table 5.

TABLE 5

Mechanical Properties After One Hour UV Curing and After 2 Day Exposure to 90% Relative Humidity After One Flour UV Curing

| Property | Example 2 |
|---|---|
| Tensile Modules (Mpa) | 1780 |
| Tensile Strength (Mpa) | 44 |
| Elongation at Break (%) | 5.25–5.9 |

Mechanical Properties After One Hour UV Curing and Two Hour Thermal Treatment and After 2 Day Exposure to 90% Relative Humidity

| Property | Example 1 | Example 2 |
|---|---|---|
| Tensile Modules (Mpa) | 2400 | 2000 |
| Tensile Strength (Mpa) | 71 | 64 |
| Elongation at Break (%) | 7.25–8.1 | 8.75–9.6 |

The measured mechanical properties for formulation No. 1 after one hour exposure to UV light or after curing with one hour exposure to UV light and then thermal treatment by heating slowly from room temperature to 140° C. over a two hour period followed by exposure in 90% relative humidity for two days is shown in Table 6.

TABLE 6

Mechanical Properties After One Hour UV Curing and Two Hour Thermal Treatment, Followed by 2 Day Exposure to 90% Relative Humidity

| Property | Example 1 |
|---|---|
| Tensile Modules (Mpa) | 1900 |
| Tensile Strength (Mpa) | 50–63 |
| Elongation at Break (%) | 7.9–11.9 |

This example shows that the materials of the present invention are very humidity resistant and do not change their mechanical properties even after a prolonged exposure to high humidity conditions.

While the invention has been described above with reference to specific embodiments thereof, it is apparent that many changes, modifications, and variations can be made without departing from the inventive concept disclosed herein. Accordingly, it is intended to embrace all such changes, modifications and variations that fall within the spirit and broad scope of the appended claims. All patent applications, patents and other publications cited herein are incorporated by reference in their entirety.

What is claimed is:

1. A liquid radiation-curable composition that comprises
   (A) at least one polymerizing organic substance comprising a mixture of
      (1) at least one alicyclic epoxide having at least two epoxy groups; and
      (2) at least one difunctional or higher functional glycidylether of a polyhydric compound;
   (B) at least one free-radical polymerizing organic substance comprising a mixture of
      (1) at least one aromatic di(meth)acrylate compound; and
      (2) optionally, at least one trifunctional or higher functional (meth)acrylate compound; and
   (C) at least one cationic polymerization initiator;
   (D) at least one free-radical polymerization initiator;
   (E) optionally at least one hydroxyl-functional aliphatic compound; and
   (F) at least one hydroxyl-functional aromatic compound selected from the ground consisting of bisphenol A, bisphenol S, ethoxylated bisphenol A, and ethoxylated bisphenol S;
      wherein the concentration of hydroxyl groups in the radiation-curable composition is at least about 1.1 equivalent OH groups per kilogram; wherein the concentration of epoxy groups in the radiation-curable composition is at least about 5.5 equivalent epoxy groups per kilogram; and wherein the amount of trifunctional or higher functional (meth)acrylate compound (B)(2) is from 0% to about 3% of the composition and the amount of aromatic di(meth)acrylate compound (B)(1) is at least 10% of the composition.

2. The composition of claim 1 wherein component (A)(1) is 3,4-epoxycyclohexylmethyl-3',4'-epoxycyclohexane carboxylate.

3. The composition of claim 1 wherein component (A)(1) constitutes from about 50% to about 60% by weight of the total liquid radiation-curable composition.

4. The composition of claim 1 wherein component (A)(2) is trimethylol propane triglycidylether.

5. The composition of claim 1 wherein component (A)(2) constitutes about 10% to about 25% by weight of the total liquid-radiation curable composition.

6. The composition of claim 1 wherein the component (A)(1) constitutes about 5% to about 90% by weight and the component (A)(2) constitutes about 10% to about 50% by weight, based on the total cationic polymerizing organic substance (A).

7. The composition of claim 1 wherein component (B)(1) is a di(meth)acrylate of an aromatic diol.

8. The composition of claim 7 wherein the di(meth)acrylate of an aromatic diol is bisphenol A diglycidylether diacrylate.

9. The composition of claim 1 wherein component (B)(1) constitutes about 10% to about 20% by weight of the total liquid radiation-curable composition.

10. The composition of claim 1 wherein component (B)(2) is present and is a tri-, tetra or pentafunctional monomeric or oligomeric aliphatic, cycloaliphatic, or aromatic (meth)acrylate.

11. The composition of claim 10 wherein component (B)(2) is dipentaerythritol monohydroxy-pentaacrylate.

12. The composition of claim 1 wherein component (B)(2) is present and its amount is from about 1% to about 3% by weight of the total liquid radiation-curable composition.

13. The composition of claim 1 wherein component (C) is triarylsulfonium hexafluoroantimonate.

14. The composition of claim 1 wherein component (C) constitutes from about 0.1 to about 5% by weight of the total liquid radiation-curable composition.

15. The composition of claim 1 wherein component (D) is 1-hydroxycyclohexyl phenyl ketone.

16. The composition of claim 1 wherein component (D) constitutes from about 0.1 to about 5% by weight of the total liquid radiation-curable composition.

17. The composition of claim 1 wherein component (E) is present and is trimethylolpropane.

18. The composition of claim 17 wherein component (E) is present from about 1% to about 3% by weight of the total liquid radiation-curable composition.

19. The composition of claim 1 wherein component (F) is an ethoxylated bisphenol A.

20. The composition of claim 1 wherein component (F) constitutes from about 5% to about 20% by weight of the total liquid radiation-cured composition.

21. The composition of claim 1 wherein the curable composition additionally contains a sensitizer.

22. The composition of claim 21 wherein sensitizer is pyrene.

23. The composition of claim 1 wherein the curable composition additionally contains a cationic stabilizer.

24. The composition of claim 23 wherein the cationic stabilizer is benzyldimethylamine.

25. A liquid radiation-curable composition useful for the production of three dimensional articles by stereolithography that comprises
   (A) at least one cationically polymerizing organic substance comprising a mixture of:
      (1) 3,4-epoxycyclohexylmethyl-3',4'-epoxycyclohexanecarboxylate; and
      (2) trimethylol propane triglycidylether;
   (B) at least one free-radical polymerizing organic substance comprising a mixture of:
      (1) at least one di(meth) acrylate of an aromatic diol; and
      (2) at least one tri-, tetra or pentafunctional monomeric or oligomeric aliphatic, cycloaliphatic or aromatic (meth)acrylate;
   (C) at least one cationic polymerization initiator;
   (D) at least one free radical polymerization initiator;
   (B) trimethylolpropane; and
   (F) ethoxylated bisphenol A;
   wherein the concentration of hydroxyl groups in the radiation-curable composition is at least 1.1 equivalent OH groups per kilogram, wherein the concentration of epoxy groups in the radiation-curable composition is at least about 5.5 equivalent epoxy group per kilogram; and the amount of component B(2) is from about 1% to 3% of the total compositions and the amount of component B(1) is from about 10% to about 20% by weight of the total composition.

26. A process for forming a three-dimensional article, said process comprising the steps:
   (1) coating a thin layer of a composition onto a surface;
   (2) exposing said thin layer imagewise to actinic radiation to form an imaged cross-section, wherein the radiation is of sufficient intensity to cause substantial curing of the thin layer in the exposed areas;
   (3) coating a thin layer of the composition onto the previously exposed imaged cross-section;

(4) exposing said thin layer from step (3) imagewise to actinic radiation to form an additional imaged cross-section, wherein the radiation is of sufficient intensity to cause substantial curing of the thin layer in the exposed areas and to cause adhesion to the previously exposed imaged cross-section;

(5) repeating steps (3) and (4) a sufficient number of times in order to build up the three-dimensional article;

wherein the composition is that which is described in claim 1.

* * * * *